(12) United States Patent
Kim

(10) Patent No.: US 10,314,193 B2
(45) Date of Patent: Jun. 4, 2019

(54) ELECTRONIC CONTROL DEVICE

(71) Applicant: HYUNDAI AUTRON CO., LTD., Seoul (KR)

(72) Inventor: Chang Ju Kim, Seongnam-Si (KR)

(73) Assignee: HYUNDAI AUTRON CO., LTD., Seoul (KR)

( * ) Notice: Subject to any disclaimer, the term of this patent is extended or adjusted under 35 U.S.C. 154(b) by 0 days.

(21) Appl. No.: 16/168,700

(22) Filed: Oct. 23, 2018

(65) Prior Publication Data

US 2019/0132982 A1 May 2, 2019

(30) Foreign Application Priority Data

Nov. 1, 2017 (KR) .................. 10-2017-0144966

(51) Int. Cl.
| | |
|---|---|
| *H05K 1/14* | (2006.01) |
| *H05K 7/14* | (2006.01) |
| *H05K 5/00* | (2006.01) |
| *H01R 12/70* | (2011.01) |

(52) U.S. Cl.
CPC ....... *H05K 7/1427* (2013.01); *H01R 12/7011* (2013.01); *H05K 1/148* (2013.01); *H05K 5/006* (2013.01); *H05K 5/0069* (2013.01); *H05K 2201/10189* (2013.01); *H05K 2201/10598* (2013.01)

(58) Field of Classification Search
CPC .... H05K 7/1427; H05K 1/148; H05K 5/0069; H05K 5/006; H05K 2201/10189; H05K 2201/10598; H01R 12/7011
See application file for complete search history.

(56) References Cited

U.S. PATENT DOCUMENTS

| | | | | |
|---|---|---|---|---|
| 7,390,199 B2* | 6/2008 | Honda | ................... | H01R 12/57 439/78 |
| 7,450,382 B1* | 11/2008 | Fischer | .............. | H05K 7/20545 361/688 |
| 7,826,232 B2* | 11/2010 | Von Arx | .............. | H01R 13/514 361/788 |
| 9,013,889 B2* | 4/2015 | Tamura | ................ | H05K 5/0052 361/757 |

(Continued)

FOREIGN PATENT DOCUMENTS

| | | |
|---|---|---|
| JP | 2005-191130 A | 7/2005 |
| JP | 2005-317649 A | 11/2005 |

(Continued)

*Primary Examiner* — Abhishek M Rathod
(74) *Attorney, Agent, or Firm* — Morgan, Lewis & Bockius LLP

(57) ABSTRACT

The present invention relates to an electronic control device. The present invention provides an electronic control device including: a housing which includes sidewalls that are disposed in a polygonal shape, and a bottom plate that closes one side of the sidewalls; and a PCB-connector assembly which includes multiple PCB-connector modules each including a printed circuit board and a connector connected to one side of the printed circuit board, in which the adjacent PCB-connector modules are connected through a flexible connecting portion, in which the PCB-connector assembly is coupled to the housing in a state in which the multiple PCB-connector modules are folded at the flexible connecting portions.

7 Claims, 8 Drawing Sheets

(56) References Cited

U.S. PATENT DOCUMENTS

| | | | |
|---|---|---|---|
| 9,320,168 B2 | 4/2016 | Drew et al. | |
| 9,395,765 B2* | 7/2016 | Hoss | G06F 1/181 |
| 9,990,011 B2* | 6/2018 | Carota | G06F 1/183 |
| 2005/0007736 A1* | 1/2005 | Glovatsky | H05K 7/1434 |
| | | | 361/688 |
| 2006/0216965 A1* | 9/2006 | Yamanashi | B60R 16/0238 |
| | | | 439/76.1 |
| 2009/0180265 A1* | 7/2009 | Chlumsky | H05K 5/006 |
| | | | 361/759 |
| 2011/0102991 A1* | 5/2011 | Sullivan | G06F 1/1601 |
| | | | 361/679.02 |
| 2014/0160683 A1* | 6/2014 | Snider | H04B 1/082 |
| | | | 361/709 |
| 2014/0254109 A1* | 9/2014 | Lucas | H05K 1/148 |
| | | | 361/749 |
| 2015/0250022 A1* | 9/2015 | Kim | H04W 88/08 |
| | | | 455/561 |
| 2015/0345282 A1* | 12/2015 | Logan | E21B 47/01 |
| | | | 166/65.1 |
| 2016/0084479 A1* | 3/2016 | Togawa | G01N 21/8806 |
| | | | 362/382 |
| 2016/0174378 A1* | 6/2016 | Johnson | H05K 1/147 |
| | | | 361/760 |
| 2016/0270262 A1* | 9/2016 | Crawford | H05K 7/20736 |
| 2017/0215287 A1* | 7/2017 | Westphall | H05K 7/1487 |

FOREIGN PATENT DOCUMENTS

| | | |
|---|---|---|
| JP | 2013-258184 A | 12/2013 |
| KR | 10-2017-0069655 A | 6/2017 |

\* cited by examiner

ELECTRONIC CONTROL DEVICE

CROSS-REFERENCE TO RELATED APPLICATION

The present application claims priority to Korean Patent Application No. 10-2017-0144966, filed on Nov. 1, 2017, the entire contents of which is incorporated herein for all purposes by this reference.

TECHNICAL FIELD

The present invention relates to an electronic control device. In more detail, the present invention relates to an electronic control device that compactly accommodates therein multiple printed circuit boards connected through a flexible connecting portion and has an improved heat dissipation effect.

BACKGROUND ART

An electronic control device, which includes an electronic element for control and a printed circuit board on which the electronic element is mounted, is used in various fields.

An electronic control device such as an electronic control unit (ECU), which electronically controls various types of devices, is representatively mounted in a vehicle. The electronic control device serves to receive information from sensors, switches, or the like installed at various locations in the vehicle, process the received information, and perform various types of electronic control processes to improve ride quality and safety of the vehicle or provide a driver and an occupant with various types of conveniences.

The electronic control device for a vehicle, such as the ECU, is structured to include a housing, a printed circuit board (PCB) which is accommodated in the housing, and a connector which is coupled to one side of the circuit board so as to be connected to an external socket.

As control functions become diversified and complicated, a size of the printed circuit board needs to be increased and the number of connectors needs to be increased through connection with various external devices. U.S. Pat. No. 9,320,168 discloses a control device that accommodates therein multiple PCBs.

However, there is still a need for a further improved electronic control device for implementing effective spatial utilization, a reduction in size of the device, and heat dissipation.

SUMMARY OF THE INVENTION

The present invention has been made in an effort to provide an electronic control device that may accommodate therein more components by accommodating therein multiple printed circuit boards, implement the compact device, allow the printed circuit boards to be effectively fixed to a housing, and achieve sufficient heat dissipation.

An exemplary embodiment of the present invention provides an electronic control device including: a housing which includes sidewalls that are disposed in a polygonal shape, and a bottom plate that closes one side of the sidewalls; and a PCB-connector assembly which includes multiple PCB-connector modules each including a printed circuit board and a connector connected to one side of the printed circuit board, in which the adjacent PCB-connector modules are connected through a flexible connecting portion, in which the PCB-connector assembly is coupled to the housing in a state in which the multiple PCB-connector modules are folded at the flexible connecting portions.

Heat radiating fins may be formed on an outer surface of the sidewall.

A PCB fixing protrusion, which is spaced apart from the sidewall and protrudes from the bottom plate, may be formed on the bottom plate, and an end portion of the printed circuit board may be fitted between the PCB fixing protrusion and the sidewall.

Each of the PCB-connector modules may be connected to each inner side of the sidewalls of the housing which have a polygonal shape.

The sidewalls may have a quadrangular shape, and the four PCB-connector modules may be provided, such that each of the four PCB-connector modules is coupled to each inner side of the multiple sidewalls having a quadrangular shape.

A concave portion may be formed in the connector, and an upper end portion of the sidewall may be inserted into the concave portion.

The electronic control device according to the exemplary embodiment of the present invention may further include a female connector which is coupled to an upper portion of the connector.

The female connector may include a female connector cover which surrounds an outer side of the connector, and a pin insertion portion which has a pin insertion hole into which a connector pin provided on the connector is inserted.

The connector may include a connector cover which surrounds the connector pin, and the pin insertion portion may be inserted into the connector cover.

The present invention provides an electronic control device that compactly accommodates therein the multiple printed circuit boards connected through the flexible connecting portion and has an improved heat dissipation effect.

According to the electronic control device according to the present invention, the multiple printed circuit boards may be disposed suitably for a cross-sectional shape of an external housing, and heat from the respective printed circuit boards may be effectively discharged to the external housing, and as a result, it is possible to reduce a size of the device and improve performance.

The multiple printed circuit boards and the connector assembly may be effectively fixed to the housing, and the number of connectable connectors may be increased, and as a result, it is possible to achieve more various types of electrical connections with the external device.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 1:
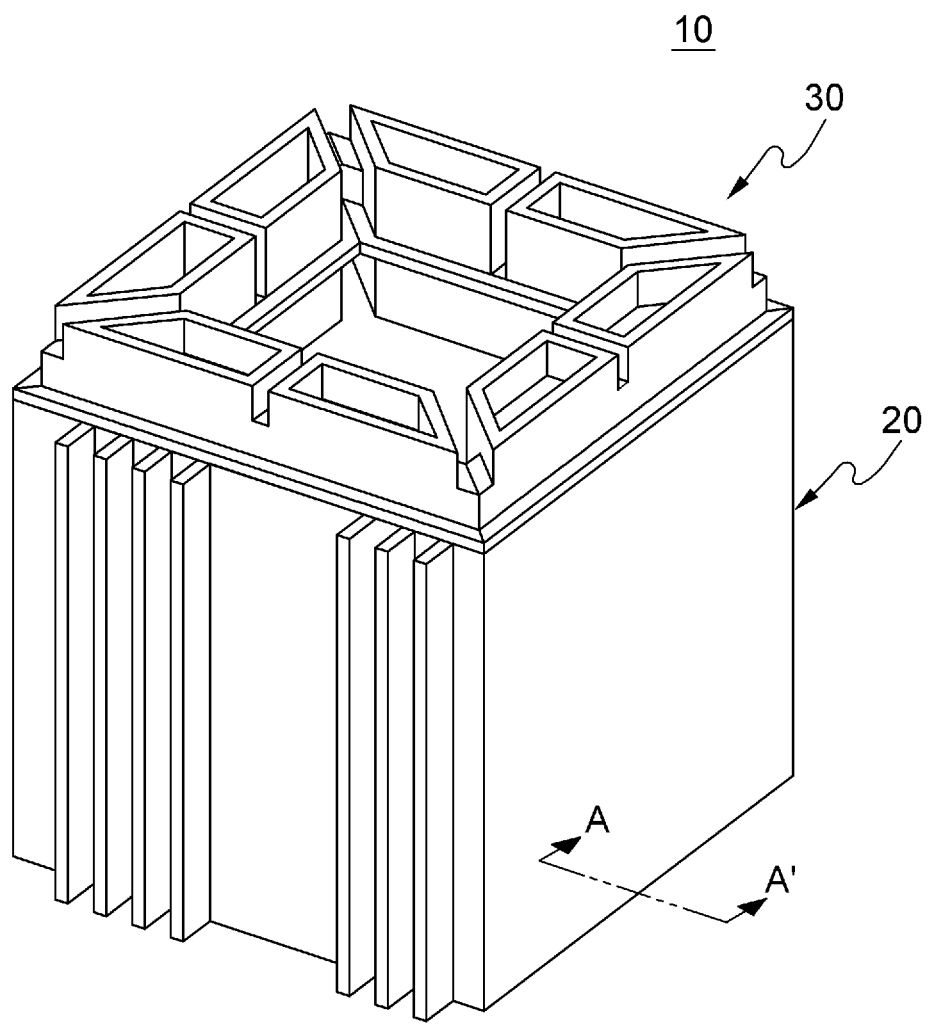
FIG. 1 is a perspective view of an electronic control device according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, exemplary embodiments of the present invention will be described in detail with reference to the accompanying drawings. First, in assigning reference numerals to constituent elements of the respective drawings, it should be noted that the same constituent elements will be designated by the same reference numerals, if possible, even though the constituent elements are illustrated in different drawings. Further, in the following description of the present invention, a detailed description of publicly known configurations or functions incorporated herein will be omitted when it is determined that the detailed description may make the subject matter of the present invention unclear. Further, exemplary embodiments of the present invention will be described below, but the technical spirit of the present invention is not limited thereto and may of course be modified and variously carried out by those skilled in the art.

Figure 2:
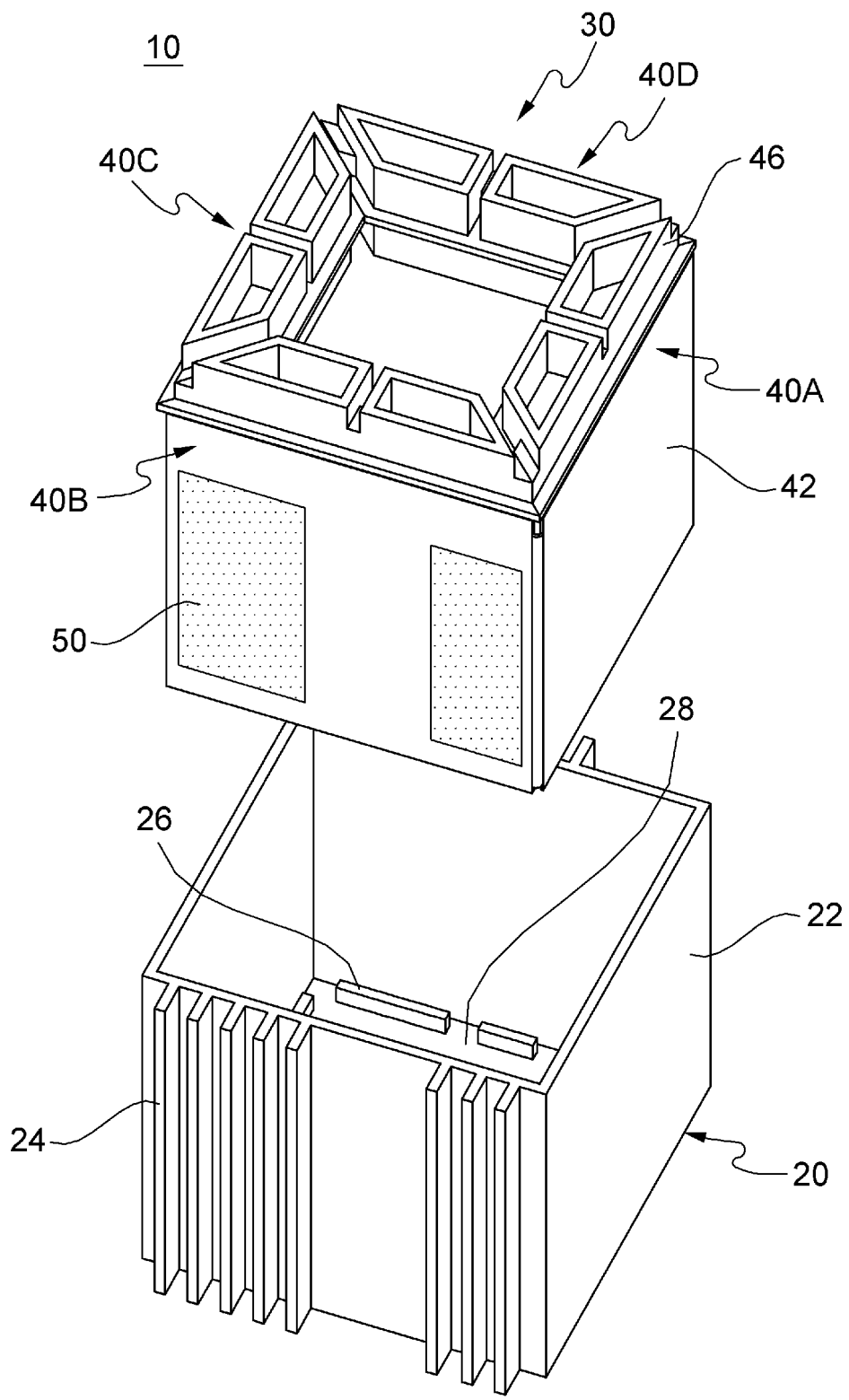
FIG. 2 is an exploded perspective view of the electronic control device according to the exemplary embodiment of the present invention.
Figure 3:
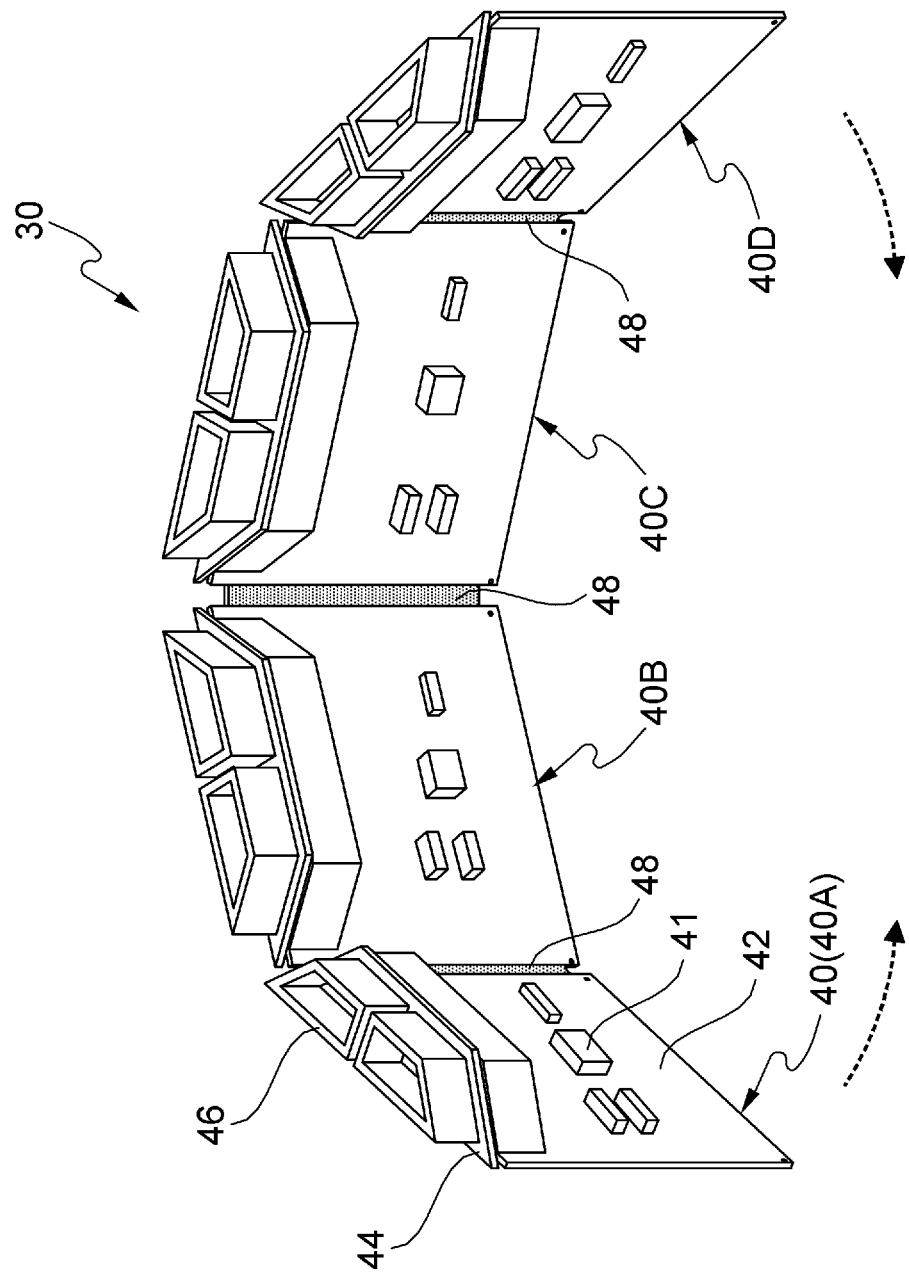
FIG. 3 is a view illustrating a PCB-connector assembly in the electronic control device according to the exemplary embodiment of the present invention.
Figure 4:
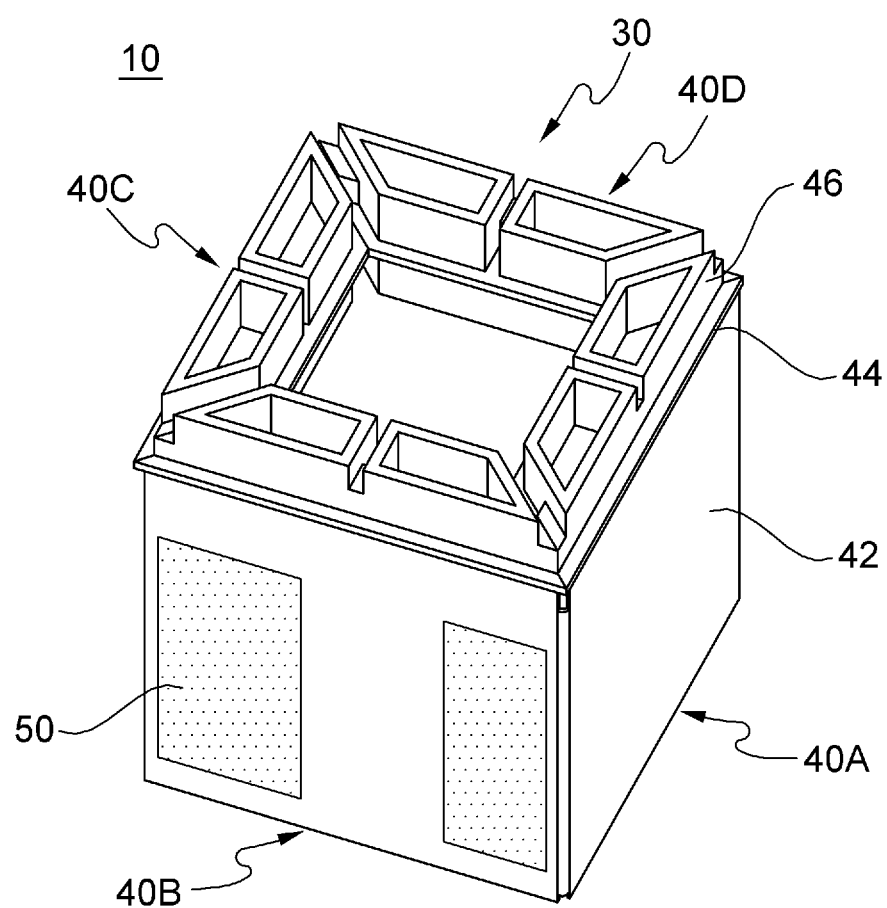
FIG. 4 is a perspective view illustrating a state in which the PCB-connector assembly is folded in the electronic control device according to the exemplary embodiment of the present invention.

FIG. 1 is a perspective view of an electronic control device according to an exemplary embodiment of the present invention, and FIG. 2 is an exploded perspective view of the electronic control device according to the exemplary embodiment of the present invention. In addition, FIG. 3 is a view illustrating a PCB-connector assembly in the electronic control device according to the exemplary embodiment of the present invention, and FIG. 4 is a perspective view illustrating a state in which the PCB-connector assembly is folded in the electronic control device according to the exemplary embodiment of the present invention.

An electronic control device 10 according to an exemplary embodiment of the present invention includes a housing 20, and a PCB-connector assembly 30 coupled to the housing 20.

The housing 20 has sidewalls 22, and a bottom plate 28 which covers a bottom side of the sidewalls 22, such that the housing 20 has one opened side. The sidewalls 22 may be formed to have an approximately quadrangular shape. However, in the exemplary embodiment of the present invention, the sidewalls 22 of the housing 20 may be formed to have a polygonal shape such as a triangular or pentagonal shape.

Heat radiating fins 24 may be provided on the sidewall 22 in order to dissipate heat. A PCB fixing protrusion 26, which is disposed to be spaced apart from the sidewall 22 at a predetermined distance and protrudes from the bottom plate 28, may be provided on the bottom plate 28. A width between the sidewall 22 and the PCB fixing protrusion 26 may be set in consideration of a thickness of a printed circuit board 42 included in the PCB-connector assembly 30.

The PCB-connector assembly 30 includes multiple PCB-connector modules 40. The PCB-connector modules 40 are connected through flexible connecting portions 48, and the multiple PCB-connector modules 40 are folded to correspond to the sidewalls 22 of the housing 20.

Referring to FIGS. 2 to 4, each of the PCB-connector modules 40 may include the printed circuit board (hereinafter, referred to as a 'PCB') 42 on which an electronic element 41 is mounted, and a connector 44 coupled to one side of the PCB 42, and the connector 44 may further include a connector cover 46 that protrudes outward. Multiple connector pins may be provided on the connector 44 to electrically connect the PCB 42 to an external device. In the case in which the sidewalls 22 of the housing 20 are formed in a quadrangular shape, the PCB-connector modules 40 may include first to fourth connector modules 40A, 40B, 40C, and 40D and may be mechanically and electrically connected through the flexible connecting portions 48. The flexible connecting portion 48 may be a flexible board or a flexible cable. With this configuration, the PCB-connector modules 40 may be folded, as illustrated in FIG. 4, and coupled to the housing 20.

To prevent interference between the adjacent connector modules 40A, 40B, 40C, and 40D, a lateral side of the connector 44 may be formed obliquely at a predetermined angle. As an example, in the case in which the four connector modules 40A, 40B, 40C, and 40D are provided, the lateral side of the connector 44 may be formed at an angle of 45 degrees so as to be in contact with the lateral side of the neighboring connector 44.

A heat dissipation material 50 may be provided on a rear surface of the printed circuit board 42. The heat dissipation material 50 has a semisolid shape and may be applied onto the printed circuit board 42, or the heat dissipation material 50 may be in the form of a heat dissipation pad to be attached to the printed circuit board 42. The heat dissipation material 50 is in contact with the sidewall 22 of the housing 20, such that heat may be effectively transferred from the printed circuit board 42 to the sidewall 22.

Figure 5:
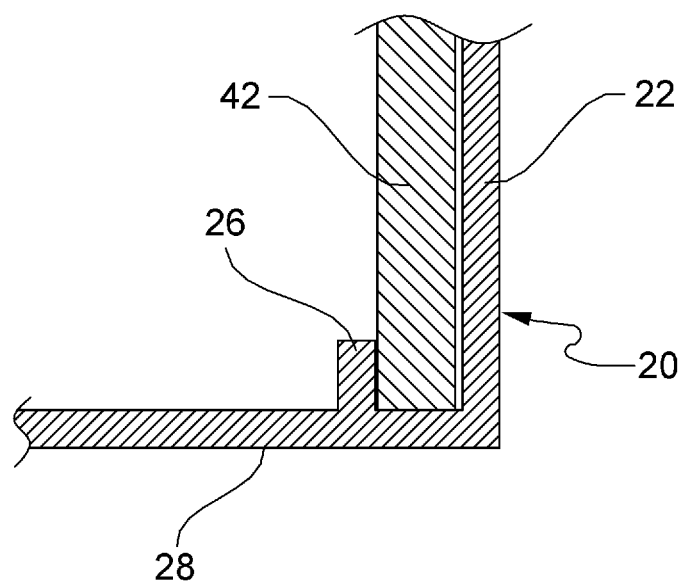
FIG. 5 is a view (cross-sectional view taken along line A-A' in FIG. 1) illustrating a state in which an end portion of the printed circuit board PCB is fixed to a bottom side of a housing.

FIG. 5 is a view (cross-sectional view taken along line A-A' in FIG. 1) illustrating a state in which an end portion of the printed circuit board PCB is fixed to the bottom side of the housing.

When the PCB-connector assembly 30 is coupled to the housing 20, an outer side of the connector 44 of the PCB-connector assembly 30 is coupled to cover upper ends of the sidewalls 22 of the housing 20, as illustrated in FIG. 1. In this case, referring to FIG. 5, the end portion of the PCB 42 is fitted between the PCB fixing protrusion 26 and the sidewall 22. Therefore, the end portion of the PCB 42 may be fixed. Meanwhile, a sealing agent may be applied onto a portion where the connector 44 and the sidewall 22 of the housing 20 are in contact with each other.

Figure 6:
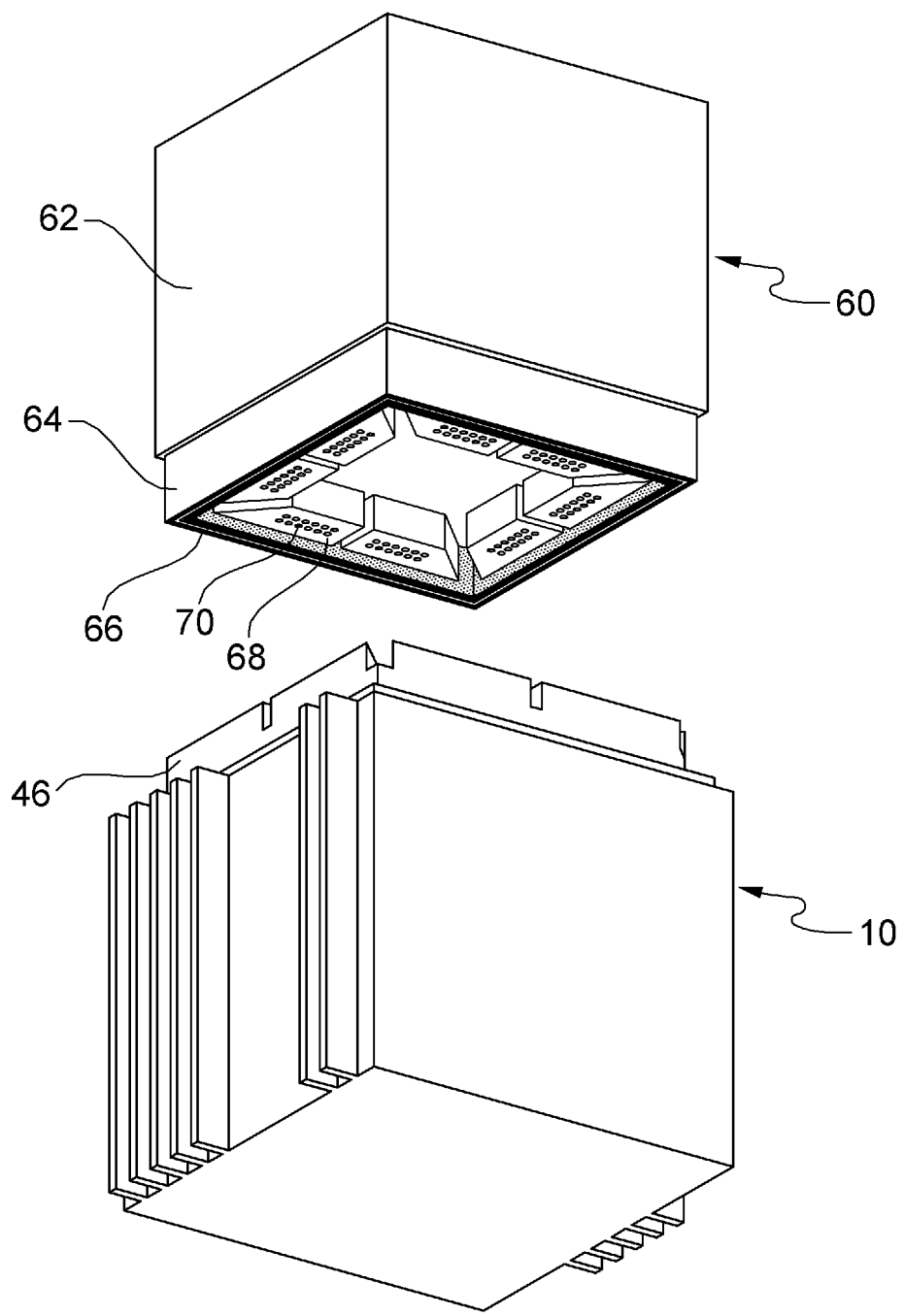
FIG. 6 is a perspective view illustrating a state in which a female connector is additionally provided in the electronic control device according to the exemplary embodiment of the present invention.

FIG. 6 is a perspective view illustrating a state in which a female connector is additionally provided in the electronic control device according to the exemplary embodiment of the present invention.

As illustrated in FIG. 6, a female connector 60 may be coupled to the electronic control device 10 according to the present invention.

The female connector 60 includes a female connector body 62, and a female connector cover 64 shaped to surround the connector cover 46 exposed to the outside, and pin insertion portions 68 having pin insertion holes 70 are provided inside the female connector cover 64.

Figure 7:
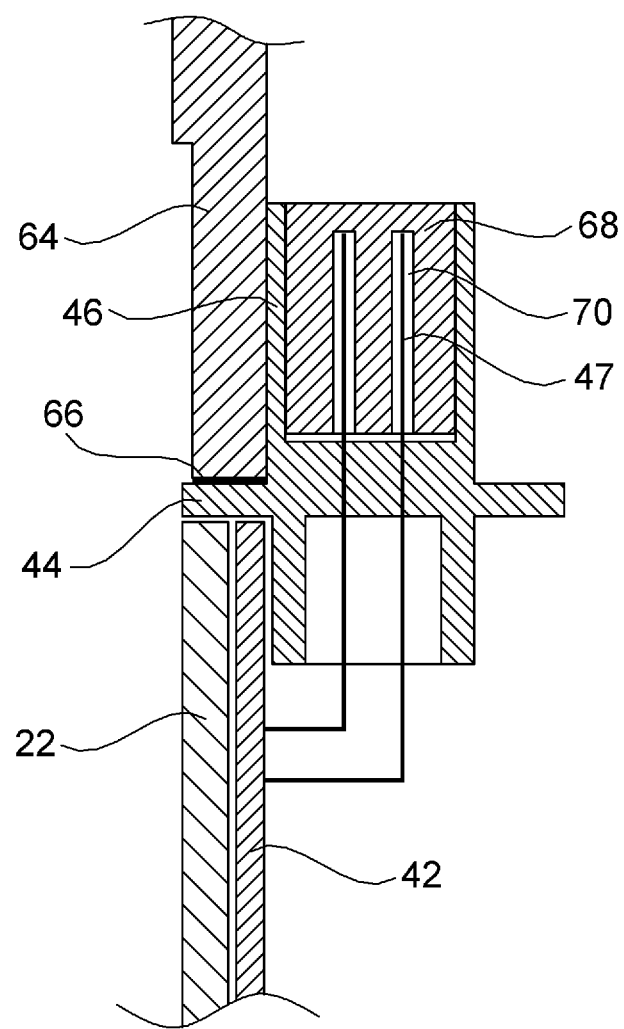
FIG. 7 is a cross-sectional view illustrating a first exemplary embodiment in which the female connector is coupled in the electronic control device according to the exemplary embodiment of the present invention.

FIG. 7 is a cross-sectional view illustrating a first exemplary embodiment in which the female connector is coupled in the electronic control device according to the exemplary embodiment of the present invention.

When the female connector 60 is coupled to the electronic control device 10, the female connector cover 64 of the female connector 60 may be coupled to surround an outer side of the connector 44. In the case in which the four PCB-connector modules 40 are provided in the PCB-connector assembly 30, the multiple connectors 44 are disposed in an approximately quadrangular shape, such that the female connector cover 64 may also be formed in a quadrangular shape.

The pin insertion portions 68, which are provided inside the female connector cover 64 of the female connector 60, are inserted into the connector cover 46. Meanwhile, the connector pins 47, which are provided inside the connector cover 46, are inserted into the pin insertion holes 70 formed in the pin insertion portions 48. A sealing agent 66 may be provided at an end portion of the female connector cover 64.

Figure 8:
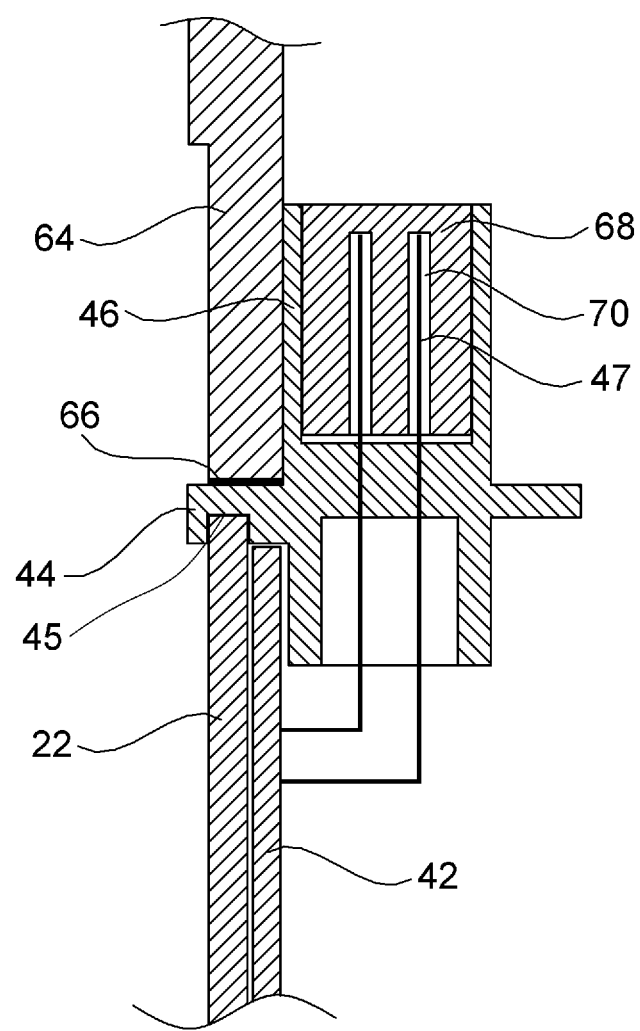
FIG. 8 is a cross-sectional view illustrating a second exemplary embodiment in which the female connector is coupled in the electronic control device according to the exemplary embodiment of the present invention.

FIG. 8 is a cross-sectional view illustrating a second exemplary embodiment in which the female connector is coupled in the electronic control device according to the exemplary embodiment of the present invention.

To couple the connector 44 to the sidewall 22 of the housing 20, a concave portion 45 may be provided in the connector 44, and the end portion of the sidewall 22 may be inserted into the concave portion 45. The end portion of the sidewall 22 is supported by being inserted into the concave portion 45 of the connector 44, and a lower end of the PCB 42 is supported by a PCB fixing protrusion 26, such that the PCB-connector modules 40 are fixed in the housing 20. In addition, the sealing agent may be provided on the concave portion 45 to seal a portion between the concave portion 45 and the sidewall 22.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. An electronic control device comprising:
    a housing which includes sidewalls that are disposed in a polygonal shape, and a bottom plate that closes one side of the sidewalls; and
    a PCB-connector assembly which includes multiple PCB-connector modules each including a printed circuit board and a connector connected to one side of the printed circuit board, in which the adjacent PCB-connector modules are connected through a flexible connecting portion,
    wherein the PCB-connector assembly is coupled to the housing in a state in which the multiple PCB-connector modules are folded at the flexible connecting portions;
    wherein each of the PCB-connector modules is connected to each inner side of the sidewalls of the housing;
    wherein a concave portion is formed in the connector of each of the PCB-connector modules, and an upper edge of the respective sidewalls is inserted into the respective concave portions.

2. The electronic control device of claim 1, wherein heat radiating fins are formed on an outer surface of one of the sidewalls.

3. The electronic control device of claim 1, wherein a PCB fixing protrusion, which is spaced apart from the sidewall and protrudes from the bottom plate, is formed on the bottom plate, and an end portion of the printed circuit board is fitted between the PCB fixing protrusion and the sidewall.

4. The electronic control device of claim 1, wherein the sidewalls form a quadrangular shape, and
    Wherein the multiple PCB-connector modules comprises four PCB-connector modules, wherein the four PCB-connector modules are provided, such that each of the four PCB-connector modules is coupled to each inner side of the sidewalls.

5. The electronic control device of claim 1, further comprising:
    a female connector which is coupled to an upper portion of the connector.

6. The electronic control device of claim 5, wherein the female connector includes a female connector cover which surrounds an outer side of the connector, and a pin insertion portion which has a pin insertion hole into which a connector pin provided on the connector is inserted.

7. The electronic control device of claim 6, wherein the connector includes a connector cover which surrounds the connector pin, and the pin insertion portion is inserted into the connector cover.

* * * * *